United States Patent
Gong et al.

(10) Patent No.: US 11,398,536 B2
(45) Date of Patent: Jul. 26, 2022

(54) DISPLAY SUBSTRATE, PRODUCTION METHOD THEREOF AND DISPLAY DEVICE

(71) Applicants: Hefei BOE Optoelectronics Technology Co., Ltd., Anhui (CN); BOE Technology Group Co., Ltd., Beijing (CN)

(72) Inventors: Kui Gong, Beijing (CN); Xianxue Duan, Beijing (CN); Tianzhen Liu, Beijing (CN); Dongsheng Jiao, Beijing (CN)

(73) Assignees: Hefei BOE Optoelectronics Technology Co., Ltd., Hefei (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 16/881,611

(22) Filed: May 22, 2020

(65) Prior Publication Data
US 2021/0028255 A1    Jan. 28, 2021

(51) Int. Cl.
*H01L 27/32* (2006.01)
*H01L 51/50* (2006.01)
*H01L 51/56* (2006.01)

(52) U.S. Cl.
CPC ...... *H01L 27/3246* (2013.01); *H01L 27/3218* (2013.01); *H01L 51/5056* (2013.01); *H01L 51/5072* (2013.01); *H01L 51/5092* (2013.01); *H01L 51/56* (2013.01); *H01L 2227/323* (2013.01)

(58) Field of Classification Search
CPC ............ H01L 27/3246; H01L 27/3218; H01L 51/5056; H01L 51/5072; H01L 51/5092; H01L 51/56
USPC ........................................................... 257/40
See application file for complete search history.

(56) References Cited

U.S. PATENT DOCUMENTS

2005/0190253 A1    9/2005  Duineveld et al.
2008/0272388 A1*  11/2008  Ushiyama ............... H01L 27/12
                                              257/98
(Continued)

FOREIGN PATENT DOCUMENTS

CN        1625814 A      6/2005
CN      108269830 A      7/2018
(Continued)

OTHER PUBLICATIONS

Office Action for corresponding Chinese Application No. 201910672169.4 dated Mar. 17, 2021.

*Primary Examiner* — Dzung Tran
(74) *Attorney, Agent, or Firm* — ArentFox Schiff LLP; Michael Fainberg (57) ABSTRACT

The present disclosure discloses a display substrate, a production method thereof and a display device. The display substrate includes: a base substrate, a pixel defining layer located on the base substrate, and an organic functional layer located on the pixel defining layer, where the pixel defining layer has opening areas for defining light emitting areas of respective sub-pixels, and contains photo-induced deforming particles; and the organic functional layer covers the opening areas and includes a plurality of parts corresponding to the respective sub-pixels one by one, and the plurality of parts are spaced from each other.

18 Claims, 7 Drawing Sheets

(56) References Cited

U.S. PATENT DOCUMENTS

| | | | | |
|---|---|---|---|---|
| 2014/0183479 A1* | 7/2014 | Park | ................... | H01L 27/3216 |
| | | | | 257/40 |
| 2016/0103342 A1* | 4/2016 | Hong | ................ | C09K 19/3066 |
| | | | | 349/42 |
| 2016/0351636 A1* | 12/2016 | Lee | ..................... | H01L 51/5212 |
| 2018/0166015 A1* | 6/2018 | Beak | .................. | H01L 27/1288 |
| 2018/0190738 A1 | 7/2018 | Park et al. | | |
| 2018/0301521 A1* | 10/2018 | Yang | .................. | H01L 27/3211 |
| 2020/0258959 A1 | 8/2020 | Mao et al. | | |

FOREIGN PATENT DOCUMENTS

| | | |
|---|---|---|
| CN | 108649057 A | 10/2018 |
| CN | 108878689 A | 11/2018 |
| CN | 109103226 A | 12/2018 |
| CN | 109728052 A | 5/2019 |

\* cited by examiner

DISPLAY SUBSTRATE, PRODUCTION METHOD THEREOF AND DISPLAY DEVICE

This application claims priority to Chinese Patent Application No. 201910672169.4, filed on Jul. 24, 2019, which is hereby incorporated by reference in its entirety.

FIELD

The present disclosure relates to the field of display technologies, and particularly relates to a display substrate, a production method thereof and a display device.

BACKGROUND

An OLED (Organic Light-Emitting Diode) has characteristics of self-luminescence, high brightness, wide angle of view, high contrast, flexibility, low energy consumption and the like and thus attracts extensive attention. As a new generation of display mode, the OLED has begun to gradually replace traditional liquid crystal displays and has been broadly applied to products such as mobile phone screens, computer displays and full-color televisions. Different from a traditional liquid crystal display technology, an OLED display technology uses an extremely thin organic material coating and a glass substrate without the need of backlight, and when current passes through, organic materials emit light. An OLED display has a lot of advantages including flexible display. Specifically, a flexible OLED display panel can be realized by using a flexible plastic substrate as a carrier and conducting a thin film encapsulation process.

SUMMARY

Embodiments of the present disclosure provide a display substrate, a production method thereof, and a display device.

A display substrate provided by an embodiment of the present disclosure includes: a base substrate, a pixel defining layer located on the base substrate, and an organic functional layer located on the pixel defining layer, where the pixel defining layer has opening areas for defining light emitting areas of respective sub-pixels, and contains photo-induced deforming particles; and the organic functional layer covers the opening areas and includes a plurality of parts corresponding to the respective sub-pixels one by one, and the plurality of parts are spaced from each other.

In a possible implementation mode, in the above-mentioned display substrate provided by the embodiment of the present disclosure, the organic functional layer includes a monocolor organic light emitting layer which only covers the opening areas; or, the organic functional layer includes a white organic light emitting layer which covers the opening areas and a part of the pixel defining layer adjacent to the opening areas.

In a possible implementation mode, in the above-mentioned display substrate provided by the embodiment of the present disclosure, the organic functional layer further includes at least one of a hole injection layer, a hole transport layer, an electron transport layer and an electron injection layer, where the hole injection layer, the hole transport layer, the electron transport layer and the electron injection layer cover the opening areas and the part of the pixel defining layer adjacent to the opening areas.

In a possible implementation mode, in the above-mentioned display substrate provided by the embodiment of the present disclosure, the photo-induced deforming particles are made from at least one following materials: a photosensitive liquid crystal elastomer material, a photosensitive material with photo-induced stress relief, and a lead lanthanum zirconate titanate ceramic material.

In a possible implementation mode, the above-mentioned display substrate provided by the embodiment of the present disclosure further includes: a cathode layer arranged wholly on one side, away from the base substrate, of the organic functional layer.

Correspondingly, an embodiment of the present disclosure further provides a production method of a display substrate, which includes: providing a base substrate; forming a resin layer doped with photo-induced deforming particles on the base substrate; exposing and developing the resin layer to form a pixel defining layer with opening areas, where the opening areas are configured to define light emitting areas of respective sub-pixels; forming an organic functional layer on the pixel defining layer; irradiating a partial area of the pixel defining layer with light, until the photo-induced deforming particles in an irradiation area deform to form bulges throughout the organic functional layer to make the organic functional layer break at positions of the bulges; and stopping irradiating the partial area of the pixel defining layer with light to make the bulges disappear.

In a possible implementation mode, in the above-mentioned production method provided by the embodiment of the present disclosure, the forming the resin layer doped with the photo-induced deforming particles on the base substrate includes: coating the base substrate with a layer of precursor solution, where the precursor solution includes a photosensitizer, a cross-linking agent, a prepolymer monomer, a hardener, an azobenzene polymer, an initiator, an additive and a solvent, where the mass fraction of the azobenzene polymer in the precursor solution ranges from 3% to 7%; and heating the precursor solution for 20 min-40 min at a temperature of 110° C. to form the resin layer doped with the azobenzene polymer.

In a possible implementation mode, in the above-mentioned production method provided by the embodiment of the present disclosure, the irradiating the partial area of the pixel defining layer with light, until the photo-induced deforming particles in the irradiation area deform to form the bulges throughout the organic functional layer includes: irradiating the partial area of the pixel defining layer with UV light, so as to enable a first orthographic projection area of the bulges formed by deformation of the photo-induced deforming particles in the irradiation area on the base substrate to be ⅙-¼ of a second orthographic projection area of the pixel defining layer on the base substrate, and enable heights of the bulges in a direction vertical to the base substrate to be 0.5 μm-1.5 μm.

In a possible implementation mode, in the above-mentioned production method provided by the embodiment of the present disclosure, the forming the organic functional layer on the pixel defining layer includes: forming a hole injection layer and a hole transport layer wholly on the pixel defining layer in sequence; forming a monocolor organic light emitting layer on the hole transport layer in the opening areas, or forming a white organic light emitting layer wholly on the hole transport layer; and forming an electron transport layer and an electron injection layer wholly on the monocolor organic light emitting layer or the white organic light emitting layer in sequence.

In a possible implementation mode, after the stopping irradiating the partial area of the pixel defining layer with light, the above-mentioned production method provided by the embodiment of the present disclosure further includes:

heating and annealing the organic functional layer; and forming a cathode layer on the organic functional layer.

In a possible implementation mode, in the above-mentioned production method provided by the embodiment of the present disclosure, the heating and annealing the organic functional layer includes: heating and annealing the organic functional layer for 15 min-30 min at a temperature of 100° C.-120° C.

On the basis of the same inventive concept, an embodiment of the present disclosure further provides a display device comprising the above-mentioned display substrate.

DETAILED DESCRIPTION OF THE EMBODIMENTS

In the related art, the OLED display panel includes a plurality of organic light emitting elements used as sub-pixels. The sub-pixels include a red sub-pixel emitting red light, a green sub-pixel emitting green light, and a blue sub-pixel emitting blue light. The sub-pixels include anodes, organic functional layers (e.g., hole injection layers, hole transport layers, electron transport layers and electron injection layers), organic light emitting layers and cathodes. The anodes of the sub-pixels are separated, but the organic functional layers are formed on the whole surface of a substrate to cover the anodes of the sub-pixels. The organic light emitting elements emit light by using holes provided by the anodes and electrons provided by the cathodes. The hole provided to the specific sub-pixel possibly drains to the adjacent sub-pixel via the organic functional layer. For example, the hole provided to the blue sub-pixel possibly does not move to the organic light emitting layer of the blue sub-pixel, but drains to the red sub-pixel or the green sub-pixel via the organic functional layer to generate leakage current. The leakage current makes the adjacent sub-pixels emit light abnormally, thus changing the color characteristic of the OLED panel.

The specific implementation modes of a display substrate, a production method thereof and a display device provided by embodiments of the present disclosure will be described in details in combination with accompanying drawings.

The shapes and sizes of film layers in the accompanying drawings do not reflect the true ratios of the film layers in the display substrate, and only intend to illustrate the content of the present disclosure.

Figure 1A:
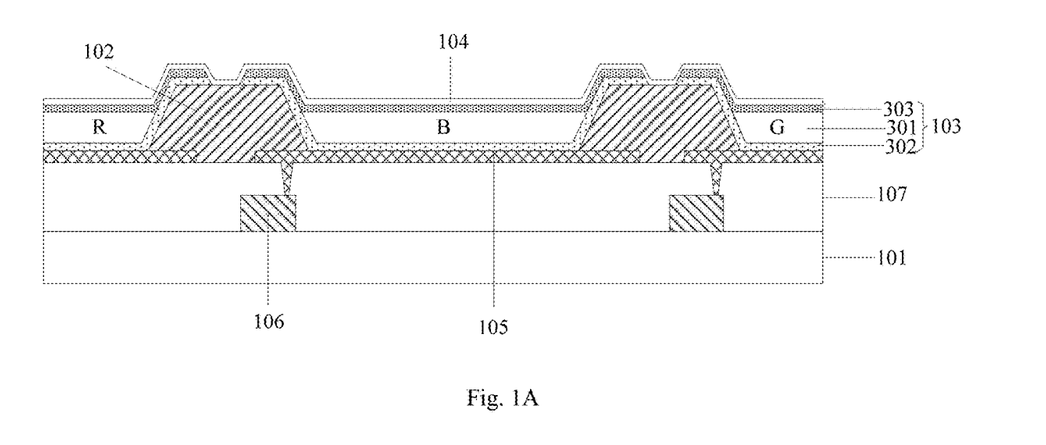
FIG. 1A is a first structural schematic diagram of a display substrate provided by an embodiment of the present disclosure.
Figure 2A:
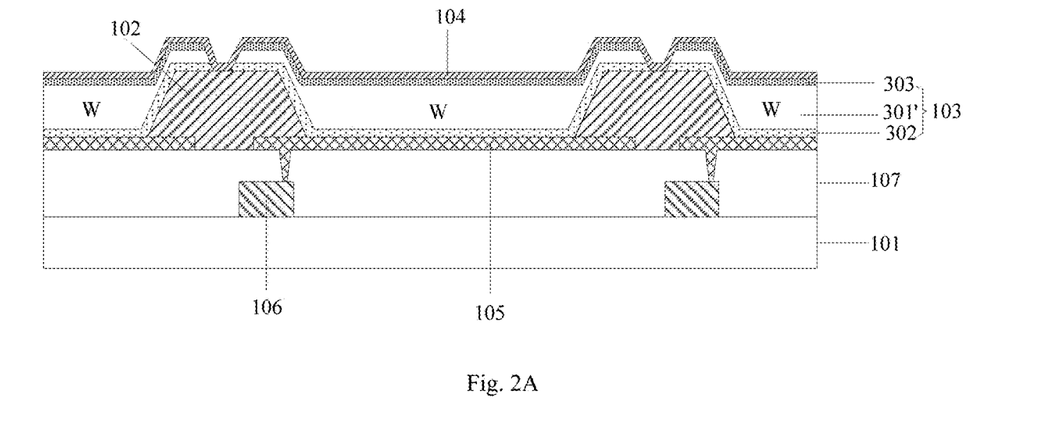
FIG. 2A is a second structural schematic diagram of a display substrate provided by an embodiment of the present disclosure.

The display substrate provided by an embodiment of the present disclosure, as shown in FIGS. 1A and 2A, includes: a base substrate 101, a pixel defining layer 102 located on the base substrate 101, and an organic functional layer 103 located on the pixel defining layer 102.

The pixel defining layer 102 has opening areas for defining light emitting areas of sub-pixels (e.g., RGB sub-pixels in FIG. 1A and W sub-pixels in FIG. 2A), and contains photo-induced deforming particles.

The organic functional layer 103 covers the opening areas and includes a plurality of parts corresponding to the respective sub-pixels one by one, and the plurality of parts are spaced from each other.

In the above-mentioned display substrate provided by the embodiment of the present disclosure, since the photo-induced deforming particles can deform under irradiation of light in specific wavelength, and resume the original shape after irradiation stops, the plurality of parts included in the organic functional layer 103 of the sub-pixels on the pixel defining layer 102 are spaced from each other due to deformation of the photo-induced deforming particles, thus preventing leakage current from flowing between the adjacent sub-pixels, avoiding defects of cross color, light leakage and the like of the display device, and improving display quality.

Figure 1B:
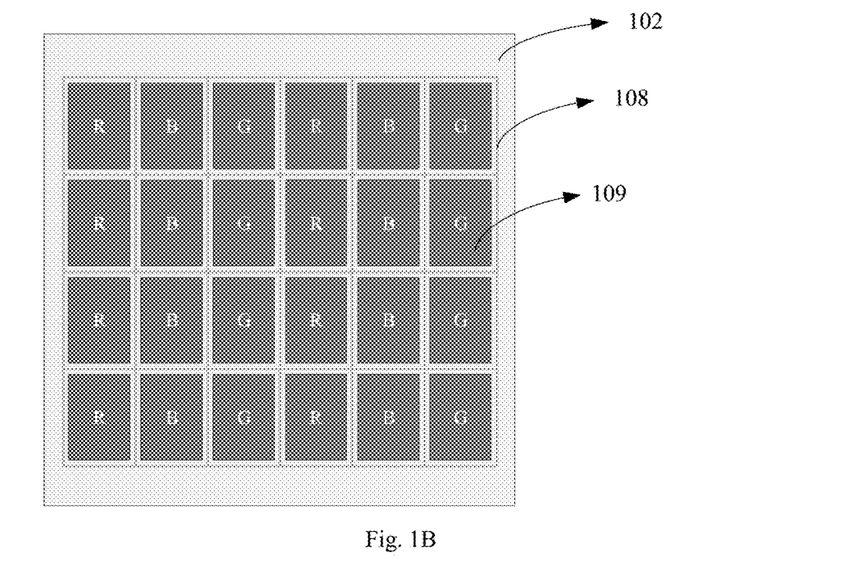
FIG. 1B is a partial top view of the display substrate of FIG. 1A provided by an embodiment of the present disclosure.
Figure 2B:
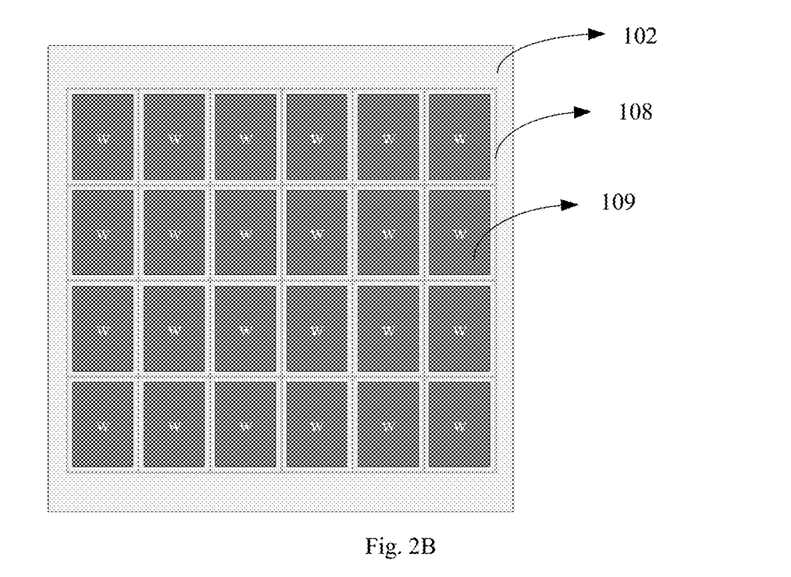
FIG. 2B is a partial top view of the display substrate of FIG. 2A provided by an embodiment of the present disclosure.

In some embodiments of the present disclosure, FIG. 1B illustrates a partial top view of the display substrate of FIG. 1A provided by an embodiment of the present disclosure, and FIG. 2B illustrates a partial top view of the display substrate of FIG. 2A provided by an embodiment of the present disclosure. As shown in FIG. 1B, the display substrate further includes one or more photo-induced deforming regions 108 and one or more pixel regions 109 in the pixel defining layer 102, where the photo-induced deforming region 108 includes the photo-induced deforming particles (not shown), and the pixel region 109 includes RGB sub-pixels. As shown in FIG. 2B, the display substrate further includes one or more photo-induced deforming regions 108 and one or more pixel regions 109 in the pixel defining layer 102, where the photo-induced deforming region 108 includes the photo-induced deforming particles (not shown), and the pixel region 109 includes W sub-pixels.

Specifically, in the above-mentioned display substrate provided by the embodiment of the present disclosure, as shown in FIG. 1A, the organic functional layer 103 includes a monocolor organic light emitting layer 301 which only covers the opening areas; or, as shown in FIG. 2A, the organic functional layer 103 can include a white organic light emitting layer 301' which covers the opening areas and a part of the pixel defining layer 102 adjacent to the opening areas.

Specifically, in the above-mentioned display substrate provided by the embodiment of the present disclosure, in order to input electrons and holes to the organic light emitting layer, as shown in FIGS. 1A and 2A, the organic functional layer 103 further includes: one of or a combination of a hole injection layer 302, a hole transport layer (not shown in the figure), an electron transport layer (not shown in the figure) and an electron injection layer 303.

The hole injection layer 302, the hole transport layer (not shown in the figure), the electron transport layer (not shown in the figure) and the electron injection layer 303 cover the opening areas and the part of the pixel defining layer 102 adjacent to the opening areas.

Specifically, in the display substrate provided by the embodiment of the present disclosure, as shown in FIGS. 1A and 2A, the display substrate further includes: a cathode layer 104 wholly arranged on one side, away from the base substrate 101, of the organic functional layer 103 to provide electrons for the organic light emitting layer.

Generally, the above-mentioned display substrate provided by the embodiment of the present disclosure, as shown in FIGS. 1A and 2A, further includes: an anode layer including a plurality of mutually independent anodes 105, a transistor array 106, a flat layer 107 and an encapsulating film layer not shown in the figure.

Specifically, in the above-mentioned display substrate provided by the embodiment of the present disclosure, the photo-induced deforming particles can be made from various materials, for example, one of or a combination of following materials: a photosensitive liquid crystal elastomer material, a photosensitive material with photo-induced stress relief, and a lead lanthanum zirconate titanate ceramic material.

The present disclosure will be described in details below by taking the photo-induced deforming particles made from the photosensitive material with photo-induced stress relief, namely azobenzene polymer (Poly-Azo), as an example.

Figure 3:
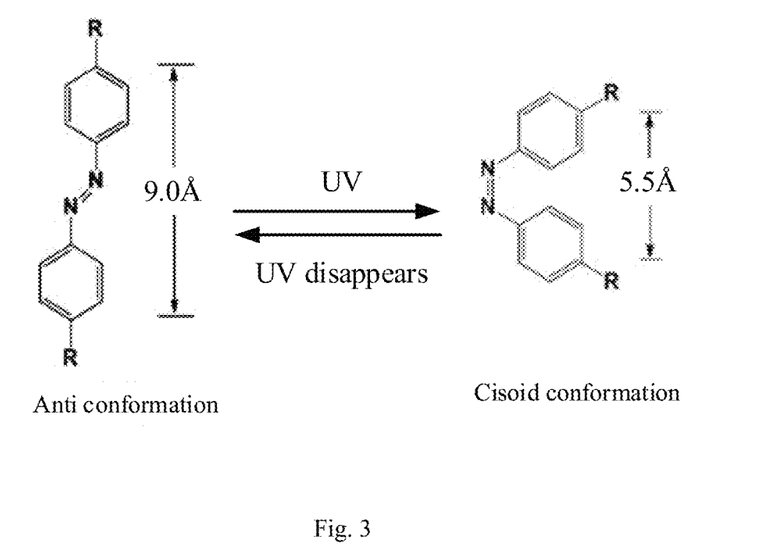
FIG. 3 is a schematic diagram of interconversion between cisoid conformation and anti-conformation of an azobenzene polymer in the related art.

Specifically, the azobenzene polymer has cisoid conformation and anti conformation, where the anti conformation is more stable, but is converted into the cisoid conformation under the effect of UV light. As shown in FIG. 3, the molecular length of the anti conformation of the azobenzene polymer is about 9.0 Å, and the molecular length of the cisoid conformation of the azobenzene polymer is 5.5 Å. When multiple azobenzene structures are contained in a molecular chain of the polymer, a mass of micro conversions usually lead to macro mass transfer of the azobenzene polymer material.

Figure 4:
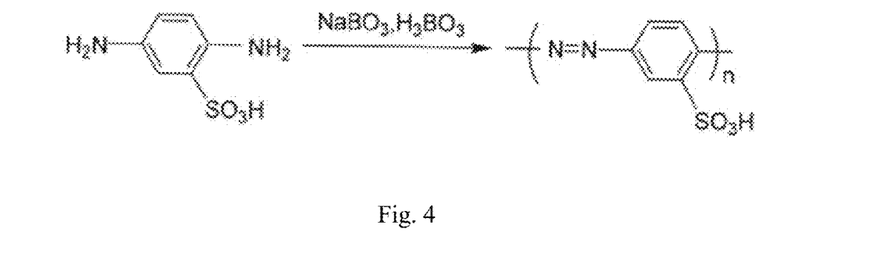
FIG. 4 is a schematic diagram of preparation of an azobenzene polymer in the related art.

The schematic diagram of preparation of the azobenzene polymer according to the present disclosure is as shown in FIG. 4. Specifically, a synthetic method is implemented as follows: a certain amount of 2,5-diaminobenzene sulfonic acid is added in a reaction vessel with nitrogenous atmosphere to be totally dissolved into ethyl alcohol to obtain a mixture, and the mixture is subjected to oxidative coupling reaction due to catalysis of trace amount of sodium borate and boric acid to generate a conjugated azobenzene polymer. The synthetic method has high conversion rate which is 70% or above, and products are collected by using a precipitation method after the reaction. By controlling stirring time to be 6-48 hours, the azobenzene polymer with a molecular weight of 1000-10000 can be synthesized. The molecular weight of the azobenzene polymer according to the present disclosure is between 5000-8000.

Specifically, the pixel defining layer 102 provided by the embodiment of the present disclosure is made from a composite material based on the azobenzene polymer, and includes following constituents: a cross-linking agent (Binder), a prepolymer monomer (Monomer), an azobenzene polymer (Poly-Azo), a hardener, a photosensitizer, an initiator, an additive and a solvent, where the cross-linking agent may be epoxy polyacrylate, the prepolymer monomer may be a polyacrylate substituted compound, the hardener may be methylhexahydrophthalic anhydride or other anhydride compounds, the initiator may be isopropyl benzene hydroperoxide or other peroxide compounds, and the solvent uses a 1-methoxy-2-propyl acetate and 1,2-dimethoxyethane mixed solvent. In order to improve the levelling property of the material, the additive uses polyester-polyether modified organosiloxane.

In addition, in the present disclosure, the pixel defining layer 102 doped with different ratios of the azobenzene polymer and a thickness of 3 µm is prepared, and UV light responsiveness and UV light absorptivity of the pixel defining layer 102 are taken into consideration, as shown in Table 1. In order to achieve the proper UV light responsiveness and UV light absorptivity of the pixel defining layer 102, the mass fraction of the azobenzene polymer in the whole raw material is controlled to be 3%-7%.

TABLE 1

| Constituent | Formula Ratio 1 (Mass Fraction) | Formula Ratio 2 (Mass Fraction) | Formula Ratio 3 (Mass Fraction) | Formula Ratio 4 (Mass Fraction) |
|---|---|---|---|---|
| Cross-linking agent | 7%-9% | 7%-9% | 7%-9% | 7%-9% |
| Prepolymer monomer | 4%-6% | 4%-6% | 4%-6% | 4%-6% |
| Azobenzene polymer | 1% | 3% | 5% | 7% |
| Hardener | 0.5%-1% | 0.5%-1% | 0.5%-1% | 0.5%-1% |
| Initiator | 0.1%-0.5% | 0.1%-0.5% | 0.1%-0.5% | 0.1%-0.5% |
| Additive | 0.1%-0.5% | 0.1%-0.5% | 0.1%-0.5% | 0.1%-0.5% |
| Solvent | 75%-80% | 75%-80% | 75%-80% | 75-80% |
| Absorptivity @350 nm | 97.5% | 95.4% | 93.3% | 90.1% |

Figure 5:
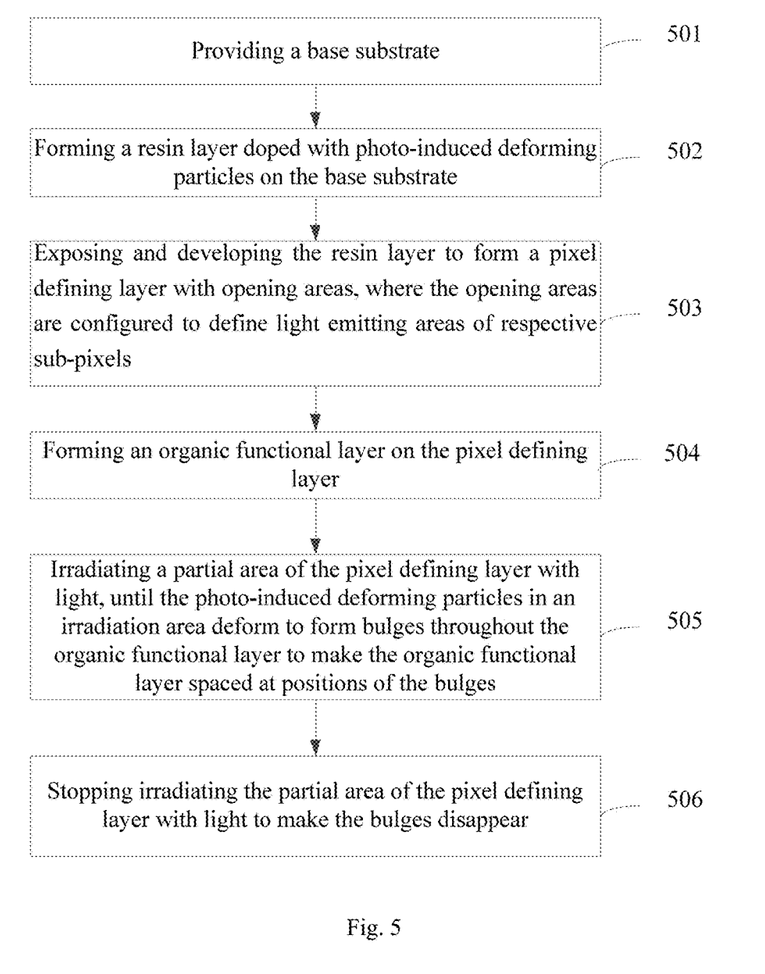
FIG. 5 is a flowchart of a production method of a display substrate provided by an embodiment of the present disclosure.

On the basis of the same inventive concept, an embodiment of the present disclosure further provides a production method of a display substrate, as shown in FIG. 5, which includes following operations.

S501. providing a base substrate.

S502. forming a resin layer doped with photo-induced deforming particles on the base substrate.

S503. exposing and developing the resin layer to form a pixel defining layer with opening areas, where the opening areas are configured to define light emitting areas of respective sub-pixels.

S504. forming an organic functional layer on the pixel defining layer.

S505. irradiating a partial area of the pixel defining layer with light, until the photo-induced deforming particles in an irradiation area deform to form bulges throughout the organic functional layer to make the organic functional layer break at positions of the bulges.

S506. stopping irradiating the partial area of the pixel defining layer with light to make the bulges disappear.

Specifically, in the above-mentioned production method provided by the embodiment of the present disclosure, S502 of forming the resin layer doped with the photo-induced deforming particles on the base substrate can be realized by using the following operation: coating the base substrate with a layer of precursor solution, where the precursor solution includes a photosensitizer, a cross-linking agent, a prepolymer monomer, a hardener, an azobenzene polymer, an initiator, an additive and a solvent, and the mass fraction of the azobenzene polymer in the precursor solution ranges from 3% to 7%; and heating the precursor solution for 20 min-40 min at a temperature of 110° C. to form the resin layer doped with the azobenzene polymer.

Specifically, in the above-mentioned production method provided by the embodiment of the present disclosure, in order to space the organic functional layer 103 without damaging a function of the pixel defining layer 102 of defining the light emitting areas of the sub-pixels, S505 of irradiating the partial area of the pixel defining layer with light, until the photo-induced deforming particles in the irradiation area deform to form the bulges throughout the organic functional layer can be realized by using the following operation: the partial area of the pixel defining layer is irradiated with UV light, so that a first orthographic projection area of the bulges formed by deformation of the photo-induced deforming particles in the irradiation area on the base substrate is ⅙-¼ of a second orthographic projection area of the pixel defining layer on the base substrate, and heights of the bulges in a direction vertical to the base substrate are 0.5 μm-1.5 μm.

Specifically, in the above-mentioned production method provided by the embodiment of the present disclosure, the forming the organic functional layer on the pixel defining layer can be realized by using the following operations: forming a hole injection layer and a hole transport layer wholly on the pixel defining layer; forming a monocolor organic light emitting layer on the hole transport layer in the opening areas, or forming a white organic light emitting layer wholly on the hole transport layer; and forming an electron transport layer and an electron injection layer wholly on the monocolor organic light emitting layer or the white organic light emitting layer in sequence.

Specifically, in the above-mentioned display substrate provided by the embodiment of the present disclosure, in order not to affect the subsequent production of a cathode layer, after S506 of stopping irradiating the partial area of the pixel defining layer with light, following operations can further be executed: heating and annealing the organic functional layer; and forming the cathode layer on the organic functional layer.

Specifically, in the above-mentioned production method provided by the embodiment of the present disclosure, the heating and annealing the organic functional layer includes a following operation: heating and annealing the organic functional layer for 15 min-30 min at a temperature of 100° C.-120° C.

To better understand the technical solution of the production method of the present disclosure, the present disclosure will be described in details below by taking the photo-induced deforming particles being the azobenzene polymer and the organic light emitting layer being the monocolor organic light emitting layer as an example.

Figure 6:
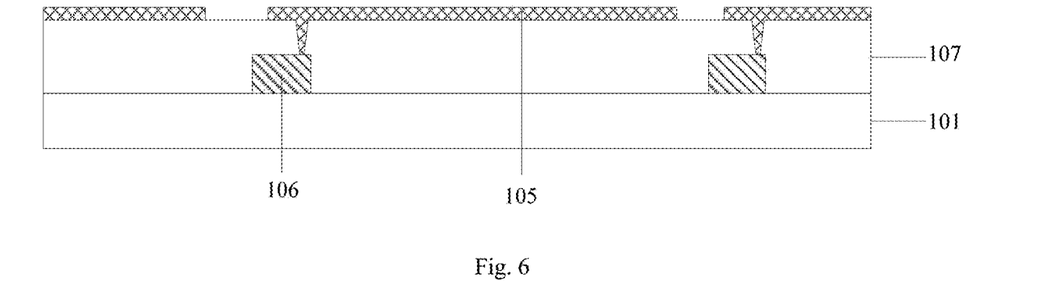
FIGS. 6-11 are respectively structural schematic diagrams of a display substrate formed by operations in a production method of the display substrate provided by an embodiment of the present disclosure.

A transistor array 106, a flat layer 107 and an anode layer including a plurality of anodes 105 are produced in sequence on the base substrate 101 in a common way, as shown in FIG. 6.

Figure 7:
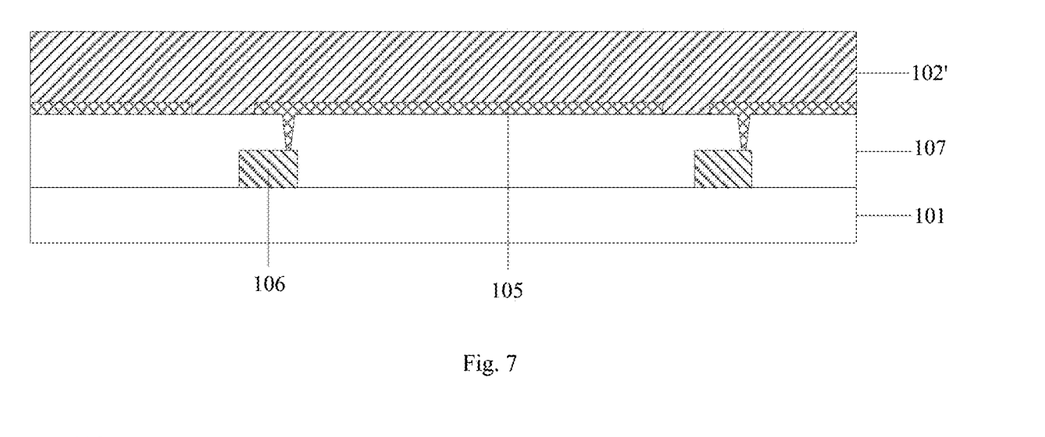

The anode layer is coated with a layer of precursor solution containing the photosensitizer, the cross-linking agent, the prepolymer monomer, the hardener, the azobenzene polymer, the initiator, the additive and the solvent, where the mass fraction of the azobenzene polymer in the precursor solution ranges from 3% to 7%; the precursor solution is then heated for 20 min-40 min at a temperature of 110° C. to form the resin layer 102' doped with the azobenzene polymer, as shown in FIG. 7.

Figure 8:
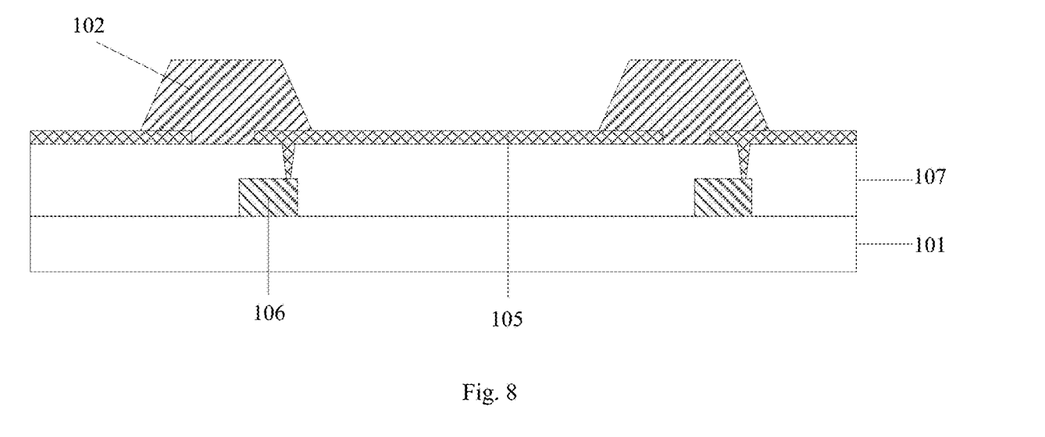

The resin layer 102' is exposed and developed to form the pixel defining layer 102 with the opening areas used for defining the light emitting areas of the sub-pixels, as shown in FIG. 8.

Figure 9:
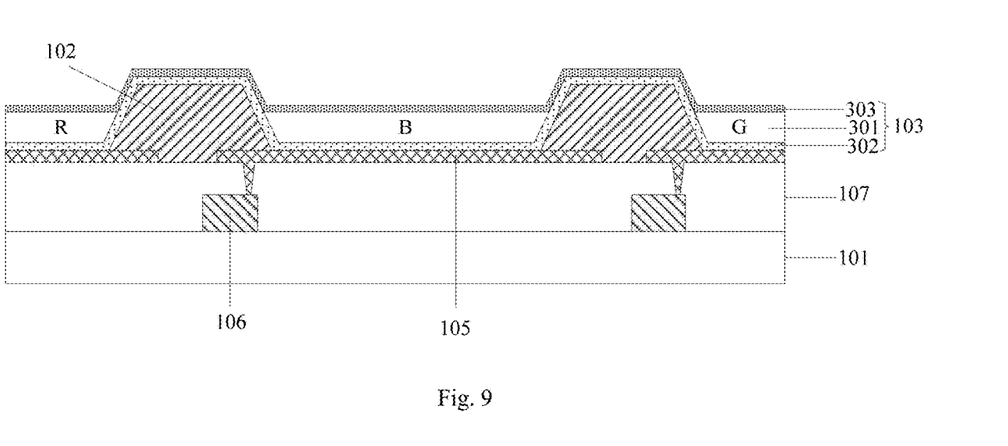

The hole injection layer 302 and the hole transport layer (not shown in the figure) are evaporated wholly on the pixel defining layer 102 through an evaporation method; then R, B and G monocolor organic light emitting layers 301 are evaporated in sequence in different sub-pixel areas by using an evaporation mask; and then the electron transport layer (not shown in the figure) and the electron injection layer 303 are wholly produced through evaporation in sequence on the R, B and G monocolor organic light emitting layers 301, as shown in FIG. 9.

Figure 10:
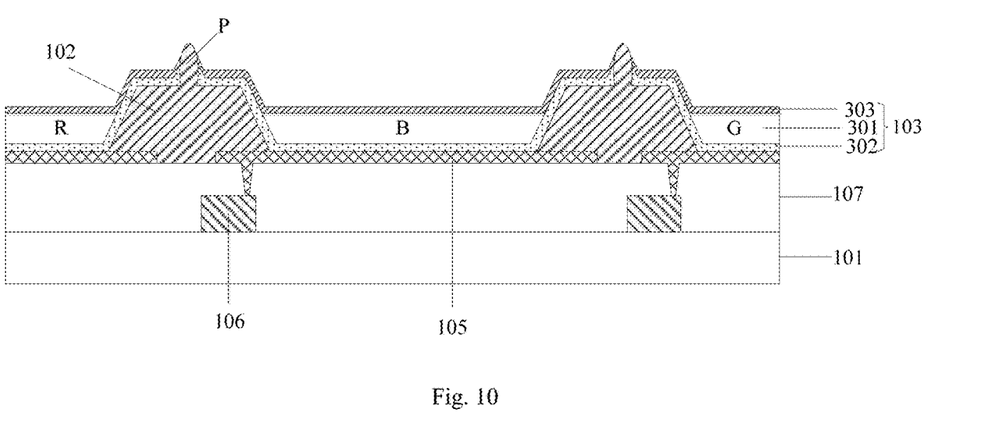

UV light in specific wavelength irradiates the partial area of the pixel defining layer 102, for example a central area of the pixel defining layer 102, through mask shielding. At this time, the photo-induced deforming particles in the irradiation area convert UV light energy into mechanical energy to be deformed, thus forming bulges P in the central area of the pixel defining layer 102. The bulges P apply an upward expansion pulling force to the organic functional layer 103, so that the organic functional layer 103 is break at positions of the bulges P, as shown in FIG. 10. It should be noted that in order to disconnect the organic functional layer 103 without damaging the function of the pixel defining layer 102 of defining the light emitting areas of the sub-pixels, the orthographic projection area of the bulges P on the base substrate 101 is ⅙-¼ of the orthographic projection area of the pixel defining layer 102 on the base substrate 101, and the heights of the bulges in the direction vertical to the base substrate 101 are 0.5 μm-1.5 μm.

Figure 11:
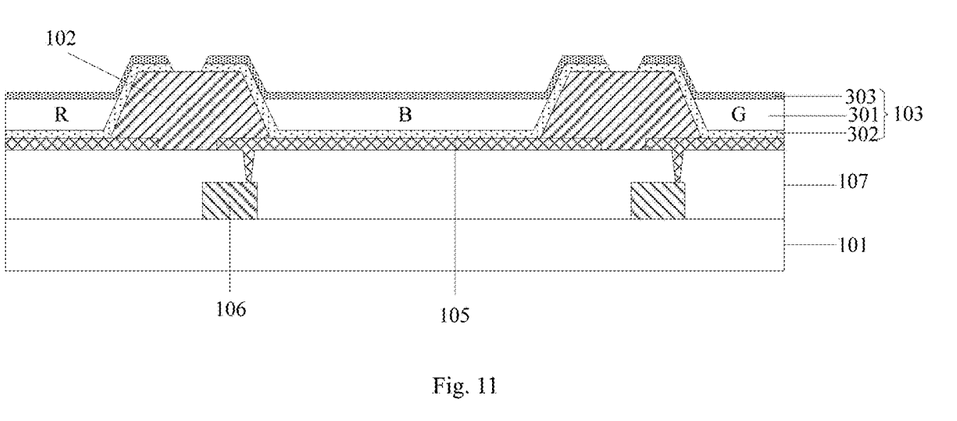

When UV light in the specific wavelength stops irradiating, the bulges P disappear, the pixel defining layer 102 resumes the shape before UV light irradiation, but the organic functional layer 103 is break at the positions of the bulges P. In order not to affect the subsequent preparation of the cathode layer 104, the organic functional layer 103 can be heated and annealed for 15 min-30 min at a temperature of 100° C.-120° C. to ensure that spaced parts of the organic functional layer 103 resume smoothness by utilizing a backflow feature of an organic thin film at a high temperature, as shown in FIG. 11.

The cathode layer 104 is produced on an upper surface of the organic functional layer 103 through evaporation or other approaches, the spaced parts of the organic functional layer 103 do not affect the cathode layer 104 after subjected to smoothing, as shown in FIG. 1A.

The production of the display substrate as shown in FIG. 1A is completed now.

It should be noted that in the above-mentioned production method provided by the embodiment of the present disclosure, a composition processes involved for forming a structure of each layer can include not only a part of or all of the processes of deposition, photoresist coating, masking, exposure, development, etching, photoresist peeling, etc., but also other processes, such as a post-baking process after development and before etching. The specific processes are dependent on a pattern to be composed in a practical production process, and are not limited herein.

The deposition process can be a chemical vapor deposition method, a plasma enhanced chemical vapor deposition method, or a physical vapor deposition method, which is not limited herein; the mask used in the masking process can be a half tone mask, a single slit mask or a gray tone mask, which is not limited herein; and the etching process can be dry etching or wet etching, which is not limited herein.

On the basis of the same inventive concept, an embodiment of the present disclosure further provides a display device comprising the above-mentioned display substrate provided by the embodiment of the present disclosure. The display device can be any product or component with a display function, such as a mobile phone, a tablet computer, a television, a display, a laptop, a digital photo frame, a navigator, a smart watch, a fitness wrist strap and a personal digital assistant. The implementation of the display device can refer to the embodiments of the above-mentioned display substrate, and repetitions are not described herein.

In the above display substrate, production method thereof and display device provided by the embodiments of the present disclosure, the display substrate includes: the base substrate, the pixel defining layer located on the base substrate, and the organic functional layer located on the pixel defining layer, where the pixel defining layer has the opening areas for defining the light emitting areas of the sub-pixels, and contains the photo-induced deforming particles; the organic functional layer covers the opening areas and includes a plurality of parts corresponding to the respective sub-pixels one by one, and the plurality of parts are spaced from each other. In the present disclosure, since the photo-induced deforming particles can deform under irradiation of light in specific wavelength, and resume the original shape after irradiation stops, the plurality of parts included in the organic functional layer of the sub-pixels on the pixel defining layer are spaced from each other due to deformation of the photo-induced deforming particles, thus preventing leakage current from flowing between the adjacent sub-pixels, avoiding defects of cross color, light leakage and the like of the display device, and improving display quality.

Obviously, without departing from the spirit and scope of the present disclosure, those skilled in the art can make various changes and modifications to the present disclosure. In this way, if the changes and modifications of the present disclosure are within the scope of the claims of the present disclosure and equivalent technologies thereof, the present disclosure further intends to cover the changes and modifications.

The invention claimed is:

1. A display substrate, comprising:
a base substrate;
a pixel defining layer located on the base substrate; and
an organic functional layer located on the pixel defining layer, wherein
the pixel defining layer has opening areas for defining light emitting areas of respective sub-pixels, and contains photo-induced deforming particles;
the organic functional layer comprises:
a hole injection layer located on the pixel defining layer and covering the opening areas and a part of the pixel defining layer adjacent to the opening areas;
a monocolor organic light emitting layer located on the hole injection layer and covering the opening areas only; and
an electron injection layer located on the monocolor organic light emitting layer and covering the opening areas and a part of the pixel defining layer adjacent to the opening areas;
the organic functional layer comprises a plurality of parts corresponding to the respective sub-pixels one by one, and the plurality of parts are spaced from each other; and
a part of the pixel defining layer is not covered by the hole injection layer and the electron injection layer.

2. The display substrate according to claim 1, wherein the organic functional layer further comprises at least one of a hole transport layer and an electron transport layer, wherein the hole injection layer, the hole transport layer and the electron transport layer cover the opening areas and a part of the pixel defining layer adjacent to the opening areas.

3. The display substrate according to claim 1, wherein the photo-induced deforming particles are made from at least one of following materials:
a photosensitive liquid crystal elastomer material, a photosensitive material with photo-induced stress relief, and a lead lanthanum zirconate titanate ceramic material.

4. The display substrate according to claim 1, further comprising: a cathode layer arranged wholly on one side, away from the base substrate, of the organic functional layer.

5. A method for preparing the display substrate according to claim 1, comprising:
providing the base substrate;
forming a resin layer doped with photo-induced deforming particles on the base substrate;
exposing and developing the resin layer to form the pixel defining layer with the opening areas, wherein the opening areas are configured to define the light emitting areas of respective sub-pixels;
forming the organic functional layer on the pixel defining layer;
irradiating a partial area of the pixel defining layer with light, until the photo-induced deforming particles in an irradiation area deform to form bulges throughout the organic functional layer to make the organic functional layer break at positions of the bulges; and
stopping irradiating the partial area of the pixel defining layer with light to make the bulges disappear.

6. The production method according to claim 5, wherein the forming the resin layer doped with the photo-induced deforming particles on the base substrate comprises:
coating the base substrate with a layer of precursor solution, wherein the precursor solution comprises a photosensitizer, a cross-linking agent, a prepolymer monomer, a hardener, an azobenzene polymer, an initiator, an additive and a solvent, wherein the mass fraction of the azobenzene polymer in the precursor solution ranges from 3% to 7%; and
heating the precursor solution for 20 min-40 min at a temperature of 110° C. to form the resin layer doped with the azobenzene polymer.

7. The production method according to claim 6, wherein the irradiating the partial area of the pixel defining layer with light, until the photo-induced deforming particles in the irradiation area deform to form the bulges throughout the organic functional layer comprises:
irradiating the partial area of the pixel defining layer with UV light to enable a first orthographic projection area of the bulges formed by deformation of the photo-induced deforming particles in the irradiation area on the base substrate to be ⅙-¼ of a second orthographic projection area of the pixel defining layer on the base substrate, and enable heights of the bulges in a direction vertical to the base substrate to be 0.5 μm-1.5 μm.

8. The production method according to claim 5, wherein the forming the organic functional layer on the pixel defining layer comprises:
forming a hole injection layer and a hole transport layer wholly on the pixel defining layer in sequence;
forming a monocolor organic light emitting layer on the hole transport layer in the opening areas, or forming a white organic light emitting layer wholly on the hole transport layer; and
forming an electron transport layer and an electron injection layer wholly on the monocolor organic light emitting layer or the white organic light emitting layer in sequence.

9. The production method according to claim 5, wherein after the stopping irradiating the partial area of the pixel defining layer with light, the production method further comprises:
heating and annealing the organic functional layer; and
forming a cathode layer on the organic functional layer.

10. The production method according to claim 9, wherein the heating and annealing the organic functional layer comprises:
heating and annealing the organic functional layer for 15 min-30 min at a temperature of 100° C.-120° C.

11. A display device, comprising a display substrate, wherein the display substrate comprises:
a base substrate;
a pixel defining layer located on the base substrate; and
an organic functional layer located on the pixel defining layer, wherein
the pixel defining layer has opening areas for defining light emitting areas of respective sub-pixels, and contains photo-induced deforming particles;
the organic functional layer comprises:
a hole injection layer located on the pixel defining layer and covering the opening areas and a part of the pixel defining layer adjacent to the opening areas;
a monocolor organic light emitting layer located on the hole injection layer and covering the opening areas only; and
an electron injection layer located on the monocolor organic light emitting layer and covering the opening areas and a part of the pixel defining layer adjacent to the opening areas;
the organic functional layer comprises a plurality of parts corresponding to the respective sub-pixels one by one, and the plurality of parts are spaced from each other; and
a part of the pixel defining layer is not covered by the hole injection layer and the electron injection layer.

12. The display device according to claim 11, wherein the organic functional layer further comprises at least one of a hole transport layer and an electron transport layer, wherein the hole transport layer and the electron transport layer cover the opening areas and a part of the pixel defining layer adjacent to the opening areas.

13. The display device according to claim 11, wherein the photo-induced deforming particles are made from at least one of following materials:
a photosensitive liquid crystal elastomer material, a photosensitive material with photo-induced stress relief, and a lead lanthanum zirconate titanate ceramic material.

14. The display device according to claim 11, further comprising: a cathode layer arranged wholly on one side, away from the base substrate, of the organic functional layer.

15. The display substrate according to claim 1, wherein:
a distance from the base substrate to a surface, facing away from the base substrate, of the part of the pixel defining layer not covered by the hole injection layer and the electron injection layer is equal to a distance from the base substrate to a surface, facing away from the base substrate, of another part of the pixel defining layer covered by the hole injection layer and the electron injection layer.

16. The display substrate according to claim 15, wherein:
the part of the pixel defining layer not covered by the hole injection layer and the electron injection layer connects directly the another part of the pixel defining layer covered by the hole injection layer and the electron injection layer.

17. The display substrate according to claim 1, wherein part of the hole injection layer is in direct contact with part of the electron injection layer.

18. The display substrate according to claim 17, wherein an orthographic projection of the electron injection layer on the base substrate is within an orthographic projection of the hole injection layer on the base substrate.

* * * * *